United States Patent
Lin et al.

(10) Patent No.: US 10,534,050 B2
(45) Date of Patent: Jan. 14, 2020

(54) METHOD AND DEVICE FOR DETERMINING INPUT VOLTAGE OF INVERTER CIRCUIT AND MAGNETIC RESONANCE IMAGING SYSTEM

(71) Applicant: Shanghai Neusoft Medical Technology Co., Ltd., Shanghai (CN)

(72) Inventors: Yingfeng Lin, Shanghai (CN); Wei Li, Shanghai (CN); Gong Cheng, Shanghai (CN)

(73) Assignee: Shanghai Neusoft Medical Technology Co., Ltd., Shanghai (CN)

( * ) Notice: Subject to any disclaimer, the term of this patent is extended or adjusted under 35 U.S.C. 154(b) by 0 days.

(21) Appl. No.: 16/006,522

(22) Filed: Jun. 12, 2018

(65) Prior Publication Data

US 2018/0356481 A1    Dec. 13, 2018

(30) Foreign Application Priority Data

Jun. 12, 2017 (CN) .......................... 2017 1 0439034

(51) Int. Cl.
*G01R 33/385*    (2006.01)
(52) U.S. Cl.
CPC ................ *G01R 33/3852* (2013.01)
(58) Field of Classification Search
CPC .............................................. G01R 33/3852
(Continued)

(56) References Cited

U.S. PATENT DOCUMENTS 5,663,647 A * 9/1997 Wirth ................. G01R 33/3852
324/322

9,222,997 B2 * 12/2015 Ham .................. G01R 33/3852
(Continued)

FOREIGN PATENT DOCUMENTS

CN    101060290 A    10/2007
CN    101920379 A    12/2010
(Continued)

OTHER PUBLICATIONS

Digital signal processor implementation and performance evaluation of split capacitor, four-leg and three H-bridge-based three-phase four-wire shunt active filters, Khadkiker, V. ; Chandra, A. ; Singh, B, IET Power Electronics, vol. 4, Issue: 4,Publication Year: 2011, pp. 463-470.
(Continued)

*Primary Examiner* — Reena Aurora
(74) *Attorney, Agent, or Firm* — Fish & Richardson P.C.

(57) ABSTRACT

Methods, devices, and apparatus for determining an input voltage of an inverter circuit in a magnetic resonance imaging system are provided. In one aspect, a method includes: determining a maximum inductance voltage value corresponding to a maximum current value of a current sequence according to a relationship between inductance voltage and inductance current of a gradient coil, determining a minimum DC voltage value corresponding to the maximum inductance voltage value according to a relationship between output voltage and input voltage of the inverter circuit, and controlling the input voltage into an input terminal of the inverter circuit to have the minimum DC voltage value when the current sequence is input into a control terminal of the inverter circuit. The inverter circuit is configured to generate an AC voltage based on the input voltage and the current sequence and output the AC voltage to the gradient coil.

20 Claims, 6 Drawing Sheets

(58) Field of Classification Search
USPC .......................................................... 324/307
See application file for complete search history.

(56) References Cited

U.S. PATENT DOCUMENTS

| | | | | |
|---|---|---|---|---|
| 9,322,890 | B2* | 4/2016 | Xu | ........................ H02M 3/3376 |
| 2018/0231623 | A1* | 8/2018 | Lin | .......................... H02M 1/12 |

FOREIGN PATENT DOCUMENTS

| | | |
|---|---|---|
| CN | 102263519 A | 11/2011 |
| CN | 103076580 A | 5/2013 |
| JP | 2000050529 A | 2/2000 |

OTHER PUBLICATIONS

Hybrid Multiconverter Conditioner Topology for High-Power Applications, Milanes-Montero, M.I. ; Romero-Cadaval, E. ; Barrero-Gonzalez, F, IEEE Transactions on Industrial Electronics, vol. 58 , Issue: 6, Publication Date: Jun. 2011, pp. 2283-2292.

Transient Response of a Wind Energy Conversion System Used as Active Filter, Todeschini, G. ; Emanuel, A.E., IEEE Transactions on Energy Conversion, vol. 26 , Issue: 2, Publication Date: Jun. 2011, pp. 522-531.

New Strategies for Application of Adaptive Filters in Active Power Filters, Pereira, R.R. ; da Silva, C.H. ; da Silva, L.E.B. ; Lambert-Torres, G. ; Pinto, J.O.P, IEEE Transactions on Industry Applications, vol. 47, Issue: 3, Publication Date: May/Jun. 2011, pp. 1136-1141.

An Active Damper for Stabilizing Power-Electronics-Based AC Systems, Wang, X.; Blaabjerg, F.: Liserre, M. ; Chen, Z.; He, J.; Li, Y., IEEE Transactions on Power Electronics, vol. 29 , Issue: 7, Publication Date: Jul. 2014; pp. 3318-3329.

Characterization, Modeling, and Application of 10-kV SiC MOSFET, Wang, J.; Zhao, T.; Li, J.; Huang, A.Q, ; Callanan, R. ; Husna, F. ; Agarwal; A., IEEE Transactions on Electron Devices, vol. 55 , Issue: 8, Publication Date: Aug. 2008, pp. 1798-1806.

Power Conversion with SiC Devices at Extremely High Ambient Temperatures, Funaki, T.; Balda, J.C.; Junghans, J.; Kashyap, A.S.; Mantooth, H.A.; Barlow, F.; Kimoto, T.; Hikihara, T, IEEE Transactions on Power Electronics, vol. 22, Issue: 4, Publication Date: Jul. 2007, pp. 1321-1329.

Ripple cancellation filter for magnetic resonance imaging gradient amplifiers, Sabate, J. ; Schutten, M. ; Steigerwald, R. ; Li, Q. ; Wirth, W.F, Published in Applied Power Electronics Conference and Exposition, 2004. APEC '04. Nineteenth Annual IEEE, Date of Conference: Feb. 22-26, 2004, pp. 792-796.

State Intellectual Property Office of the People's Republic of China, Office Action and Search Report Issued in Application No. 201710439034.4, dated Oct. 29, 2018, 7 pages, (Submitted with Machine Translation).

* cited by examiner

METHOD AND DEVICE FOR DETERMINING INPUT VOLTAGE OF INVERTER CIRCUIT AND MAGNETIC RESONANCE IMAGING SYSTEM

CROSS REFERENCE TO RELATED APPLICATIONS

This application claims priority to Chinese Patent Application No. 201710439034.4 entitled "METHOD AND DEVICE FOR DETERMINING INPUT VOLTAGE OF INVERTER CIRCUIT AND MAGNETIC RESONANCE IMAGING SYSTEM" filed on Jun. 12, 2017, the entire content of which is incorporated herein by reference.

BACKGROUND

A Magnetic Resonance Imaging (MRI) system is one of the most advanced medical imaging approaches at present, which obtains electromagnetic signals from a human body based on a magnetic resonance phenomenon and reconstructs human body information.

As a core component of the MRI system, a gradient power amplifier is provided with input by a direct-current (DC) power supply and then converts the DC power into alternating-current (AC) power. The gradient power amplifier provides current pulses of a particular waveform to a gradient coil, so that the gradient coil generates a linearly varying gradient magnetic field in an imaging space, leading to different magnetic fields at different positions in an imaging region. Thus, a human body image can be constructed.

NEUSOFT MEDICAL SYSTEMS CO., LTD. (NMS), founded in 1998 with its world headquarters in China, is a leading supplier of medical equipment, medical IT solutions, and healthcare services. NMS supplies medical equipment with a wide portfolio, including CT, Magnetic Resonance Imaging (MRI), digital X-ray machine, ultrasound, Positron Emission Tomography (PET), Linear Accelerator (LINAC), and biochemistry analyser. Currently, NMS' products are exported to over 60 countries and regions around the globe, serving more than 5,000 renowned customers. NMS's latest successful developments, such as 128 Multi-Slice CT Scanner System, Superconducting MRI, LINAC, and PET products, have led China to become a global high-end medical equipment producer. As an integrated supplier with extensive experience in large medical equipment, NMS has been committed to the study of avoiding secondary potential harm caused by excessive X-ray irradiation to the subject during the CT scanning process.

SUMMARY

The present disclosure provides methods, devices and apparatus for determining an input voltage of an invert circuit of a gradient power amplifier in a Magnetic Resonance Imaging (MRI) system, which can effectively control the input voltage of the inverter circuit to thereby improve the service life and reliability of the inverter circuit.

One aspect of the present disclosure features a method of determining an input voltage of an inverter circuit of a magnetic resonance imaging system, including: determining a maximum inductance voltage value corresponding to a maximum current value of a current sequence according to a relationship between inductance voltage and inductance current of a gradient coil of the magnetic resonance imaging system; determining a minimum DC voltage value corresponding to the maximum inductance voltage value according to a relationship between output voltage and input voltage of the inverter circuit; and controlling the input voltage into an input terminal of the inverter circuit to have the minimum DC voltage value when the current sequence is input into a control terminal of the inverter circuit. The inverter circuit is configured to generate an AC voltage based on the input voltage and the current sequence and output the generated AC voltage to the gradient coil via an output terminal of the inverter circuit.

In some implementations, the input voltage of the inverter circuit is provided by a controllable DC power supply. The controllable DC power supply can include a silicon control rectifier (SCR) circuit. The controllable DC power supply can be configured to output a DC voltage through a closed-loop control with the minimum DC voltage value as a reference value and an actual value of the DC voltage into the inverter circuit as a feedback value.

In some examples, the inverter circuit includes a plurality of cascaded H-bridges, and a voltage acquisition sensor is disposed at the output terminal of the inverter circuit and configured to obtain a pulsed voltage at the output terminal of the inverter circuit. The method can further include: sampling the pulsed voltage to obtain a sampled voltage and determining the actual value of the DC voltage input into each of the H-bridges from the sampled voltage according to different phases for the H-bridges.

In some examples, the method further includes: comparing the minimum DC voltage value with the actual value of the DC voltage to obtain a comparison result, processing the comparison result by a proportional-integral-derivative (PID) controller to obtain a processed result, and adjusting a conduction angle of the controllable DC power supply by pulse width modulation (PWM) based on the processed result such that the actual value of the DC voltage is substantially identical to the minimum DC voltage value.

Another aspect of the present disclosure features a device for determining an input voltage of an inverter circuit of a magnetic resonance imaging system. The device includes: at least one processor and at least one non-transitory machine-readable storage medium coupled to the at least one processor having machine-executable instructions stored thereon that, when executed by the at least one processor, cause the at least one processor to perform operations including: determining a maximum inductance voltage value corresponding to a maximum current value of a current sequence according to a relationship between inductance voltage and inductance current of a gradient coil of the magnetic resonance imaging system and determining a minimum DC voltage value corresponding to the maximum inductance voltage value according to a relationship between output voltage and input voltage of the inverter circuit. The inverter circuit is configured to generate an AC voltage based on the input voltage and the current sequence and output the generated AC voltage to the gradient coil via an output terminal of the inverter circuit. The device also includes a controller configured to control the input voltage into an input terminal of the inverter circuit to have the minimum DC voltage value when the current sequence is input into a control terminal of the inverter circuit.

In some implementations, the input voltage of the inverter circuit is provided by a controllable DC power supply. The controllable DC power supply can include an SCR circuit. The controller can be configured to perform a closed-loop control on a DC voltage output from the controllable DC power supply by taking the minimum DC voltage value as a reference value and an actual value of the DC voltage into the inverter circuit as a feedback value.

In some examples, the inverter circuit includes a plurality of cascaded H-bridges, and the controller is configured to: obtain a pulsed voltage at the output terminal of the inverter circuit from a voltage acquisition sensor disposed at the output terminal of the inverter circuit, obtain a sampled voltage by sampling the pulsed voltage, and determine the actual value of the DC voltage input into each of the H-bridges from the sampled voltage according to different phases for the H-bridges.

In some examples, the controller includes: a comparator configured to compare the minimum DC voltage value with the actual value of the DC voltage to obtain a comparison result; a proportional-integral-derivative (PID) controller configured to process the comparison result to obtain a processed result; and a pulse width modulator configured to adjust a conduction angle of the controllable DC power supply based on the processed result such that the actual value of the DC voltage is substantially identical to the minimum DC voltage value.

A further aspect of the present disclosure features a magnetic resonance imaging system including a gradient power amplifier having a DC power supply configured to output a DC voltage and an inverter circuit connected to the DC power supply at an input terminal and configured to generate an AC voltage according to the DC voltage and a current sequence; a spectrum analyzer connected to a control terminal of the inverter circuit and configured to output the current sequence to the inverter circuit; a gradient coil connected to an output terminal of the inverter circuit and configured to receive the AC voltage from the inverter circuit; and a device for determining an input voltage of the inverter circuit. The device includes: at least one processor and at least one non-transitory machine-readable storage medium coupled to the at least one processor having machine-executable instructions stored thereon that, when executed by the at least one processor, cause the at least one processor to perform operations including: determining a maximum inductance voltage value corresponding to a maximum current value of the current sequence according to a relationship between inductance voltage and inductance current of the gradient coil and determining a minimum DC voltage value corresponding to the maximum inductance voltage value according to a relationship between output voltage and input voltage of the inverter circuit. The device also includes a controller configured to control the input voltage into the input terminal of the inverter circuit to have the minimum DC voltage value when the current sequence is input into the control terminal of the inverter circuit.

In some implementations, the DC power supply is a controllable DC power supply, and the controller is configured to perform a closed-loop control on a DC voltage output from the controllable DC power supply by taking the minimum DC voltage value as a reference value and an actual value of the DC voltage into the inverter circuit as a feedback value.

In some examples, the inverter circuit comprises a plurality of cascaded H-bridges, and the controller includes a voltage acquisition sensor disposed at the output terminal of the inverter circuit and configured to obtain a pulsed voltage at the output terminal of the inverter circuit and a sampling circuit configured to sample the pulsed voltage to obtain a sampled voltage. The controller can be also configured to determine the actual value of the DC voltage input into each of the H-bridges from the sampled voltage according to different phases for the H-bridges.

In some examples, the controller includes: a comparator configured to compare the minimum DC voltage value with the actual value of the DC voltage to obtain a comparison result; a proportional-integral-derivative (PID) controller configured to process the comparison result to obtain a processed result; and a pulse width modulator configured to adjust a conduction angle of the controllable DC power supply based on the processed result such that the actual value of the DC voltage is substantially identical to the minimum DC voltage value.

The spectrum analyzer can be configured to output the current sequence to the inverter circuit after the input voltage of the inverter circuit is adjusted to have the minimum DC voltage value. The spectrum analyzer can be also configured to calculate a respective current sequence corresponding to an imaging sequence for each imaging scan, where the input voltage of the inverter circuit is adjusted to have the minimum DC voltage value between an interval of two adjacent imaging scans.

The details of one or more examples of the subject matter described in the present disclosure are set forth in the accompanying drawings and description below. Other features, aspects, and advantages of the subject matter will become apparent from the description, the drawings, and the claims. Features of the present disclosure are illustrated by way of example and not limited in the following figures, in which like numerals indicate like elements.

DETAILED DESCRIPTION

A gradient power amplifier can include a controller, a DC power supply, and an inverter circuit. The inverter circuit can include a power semiconductor. The DC power supply may provide an input voltage to the inverter circuit, so that the input voltage can be converted into a sufficient power through the inverter circuit. In addition, the controller may receive a current sequence including information required for imaging. Thus, the controller may control the duty cycle of the inverter circuit according to the current sequence, so that the inverter circuit can output a current of a desired magnitude and direction to the gradient coil.

The inverter circuit may realize precise control of the gradient coil with different topological structures. In some cases, a circuit topology is composed of power semiconductors. The power semiconductors can be power Metal-Oxide-Semiconductor Field-Effect Transistors (MOSFET) or Insulated Gate Bipolar Transistors (IGBT).

In an MRI process, a great current fluctuation required for a gradient coil. It may cause the current magnitude in an inverter circuit of a gradient power amplifier to continuously switch between a large current and a small current, resulting in fluctuations in the junction temperature of a power semiconductor in the inverter circuit. A metal lead in the power semiconductor may fall off due to the junction temperature fluctuation, thus resulting in a failure of the power semiconductor in the inverter circuit. Therefore, it may limit the service life and reliability of the whole gradient power amplifier.

An IGBT may be used as the power semiconductor in the inverter circuit. In the manufacturing process of the IGBT, the switching performance of the IGBT may be improved through process optimization. And also the service life of the IGBT may be prolonged by optimizing a packaging material when the IGBT is packaged. In this way, there will be high requirements for manufacturing process, leading to high manufacturing costs, but the effect is not significant.

Implementations of the present disclosure provide a new method that can effectively improve the service life and the reliability of the inverter circuit. According to the present disclosure, the loss and the junction temperature variation of a power semiconductor in the inverter circuit may be reduced by effectively controlling the input voltage of the inverter circuit, thereby improving the service life and reliability of the inverter circuit.

Figure 1:
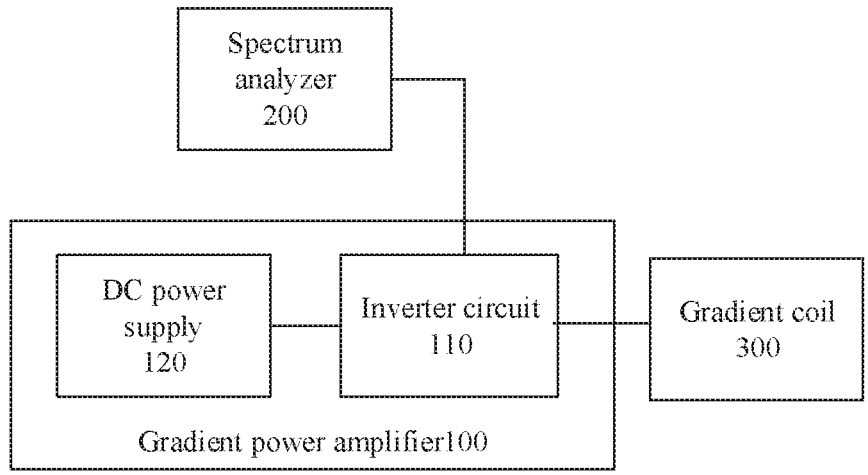
FIG. 1 is a schematic diagram illustrating connection of an inverter circuit according to an example of the present disclosure.

As shown in FIG. 1, a connection relationship of an inverter circuit 110 is as follows: the inverter circuit 110 is located in a gradient power amplifier 100), and an input terminal of the inverter circuit 110 is configured to receive a DC voltage generated by a DC power supply 120, and a control terminal of the inverter circuit 110 is configured to receive a current sequence generated by a spectrum analyzer 200 and an output terminal of the inverter circuit 110 is configured to output an AC voltage, which is generated based on the DC voltage and the current sequence, to a gradient coil 300 of a MRI system.

Figure 2:
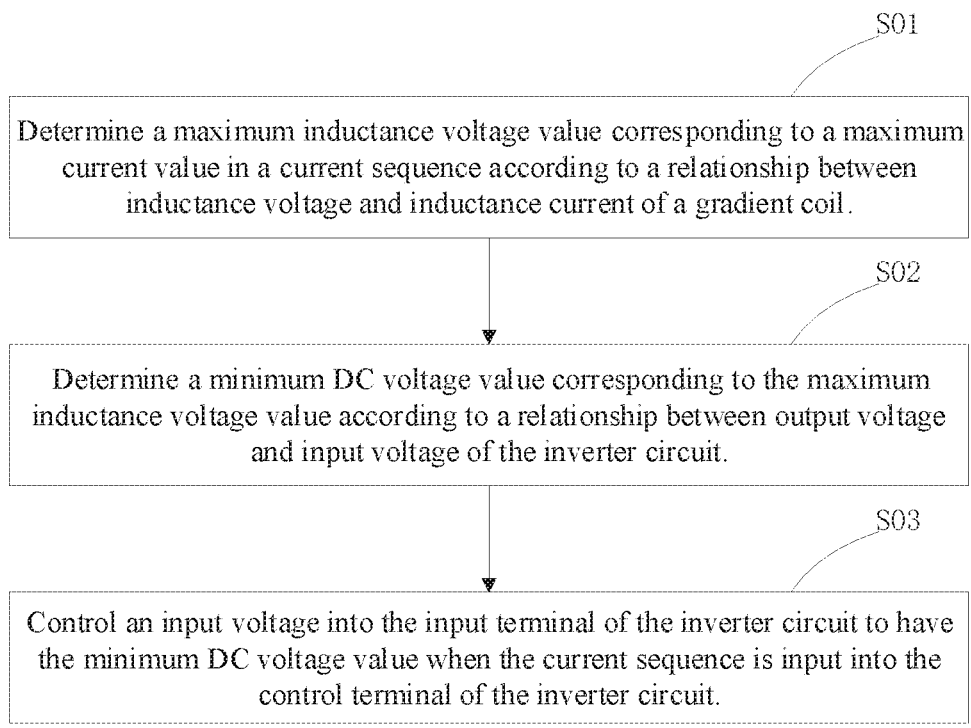
FIG. 2 is a flowchart illustrating a process of a method of determining an input voltage of an inverter circuit of a gradient power amplifier according to an example of the present disclosure.

As shown in FIG. 2, a process of a method of determining an input voltage of an inverter circuit may include the following steps.

At step S01, a maximum inductance voltage value corresponding to a maximum current value in a current sequence is determined according to a relationship between inductance voltage and inductance current of the gradient coil.

At step S02, a minimum DC voltage value corresponding to the maximum inductance voltage value is determined according to a relationship between output voltage and input voltage of the inverter circuit.

At step S03, an input voltage into the input terminal of the inverter circuit is controlled to have the minimum DC voltage value when the current sequence is input into the control terminal of the inverter circuit.

In an example of the present disclosure, the inverter circuit may have a circuit topology including power semiconductors. The power semiconductors may be power MOSFETs or IGBTs, etc. In a specific example, the topology of the inverter circuit may be a CHB topology, an asymmetrical cascaded H-bridge topology, or an active resonant clamp multi-level topology, etc.

In an example of the present disclosure, before the inverter circuit outputs according to the current sequence, the input voltage of the inverter circuit may be determined as a voltage that meets the output requirement of the current sequence, and meanwhile, the input voltage may be as small as possible. The MRI system uses a gradient coil to generate a gradient magnetic field, which changes with the current of the gradient coil. According to the requirements of specific MRI imaging, a particular series of gradient magnetic field changes can be obtained, that is, the current change requirements of the gradient coil. The series of current changes are called a current sequence. Thus, the output requirement of the inverter circuit for the current sequence can be obtained. Thus, the switching loss in the inverter circuit can be lowered and fluctuations in junction temperature can be reduced, thereby improving the service life and reliability of the inverter circuit.

To provide a better understanding of the technical solution and the technical effects of the examples of the present disclosure, detailed descriptions will be made below in conjunction with specific examples.

At step S01, a maximum inductance voltage value corresponding to a maximum current value in a current sequence is determined according to a relationship between inductance voltage and inductance current of a gradient coil.

The current sequence is a series of current information required by the gradient coil in each imaging process of an MRI system. The current sequence may include a sequence of magnitude and direction of the current. The current sequence is used for generating a corresponding current control signal to control the inverter circuit to output a current in the appropriate magnitude and direction.

Figure 2A:
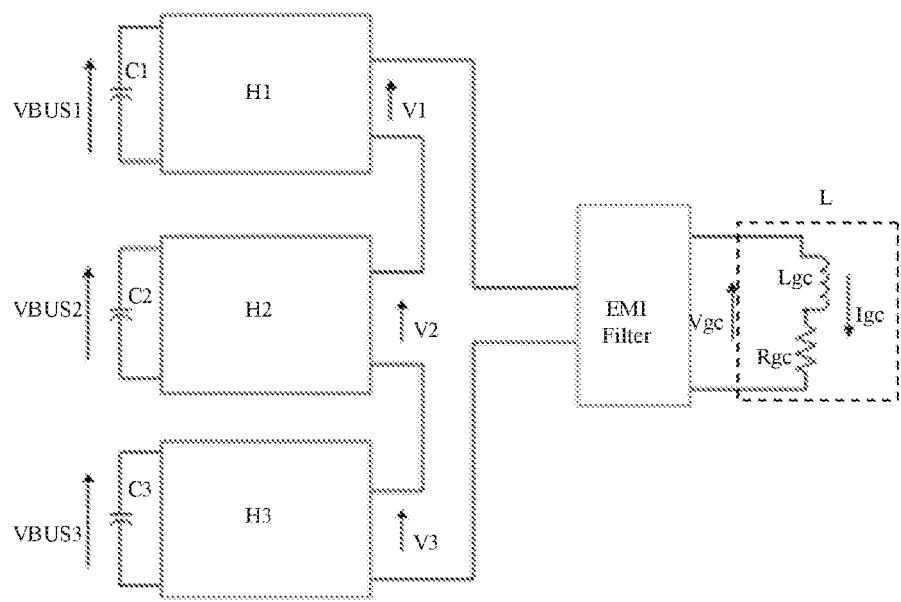
FIG. 2A and FIG. 2B are schematic diagrams illustrating structures of a cascaded H-bridge (CHB) topological circuit according to an example of the present disclosure.
Figure 2B:
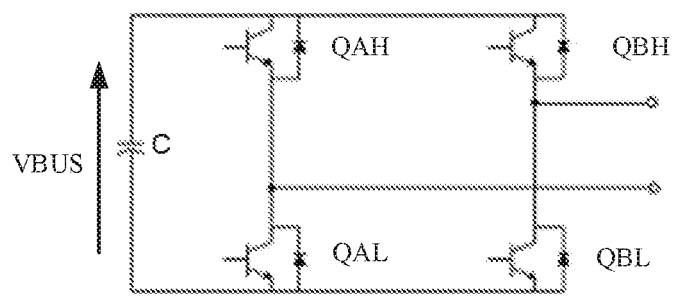

Inductance voltage values corresponding to different current values may be obtained by a calculation formula of the inductance voltage of the gradient coil. The inductance voltage value is the output voltage value of the inverter circuit. FIG. 2A illustrates a topological structure of a CHB inverter circuit, where the topological structure includes three cascaded H-bridges. The output voltage from the CHB inverter circuit is sent to a gradient coil L after passing through an Electro-Magnetic Interference (EMI) filter. FIG. 2B is a schematic diagram illustrating the structure of each H-bridge where each H-bridge includes four IGBTs and an electrolytic capacitor for energy storage. The input voltage of each H-bridge is powered by a DC power supply VBUS. The IGBTs in each H-bridge are high-speed switches, and output voltages V1, V2, V3 are out of phase with each other by 120°, thereby achieving frequency sextupling of the coil voltage. As a result, accurate current control may be achieved by controlling a duty cycle of a driving voltage of the IGBTs.

The formula (1) for calculating the inductance voltage of the gradient coil L is as follows:

$$Vgc = Lgc \times \frac{dIgc}{dt} + Igc \times Rgc, \quad (1)$$

where Vgc is the inductance voltage, Lgc is an inductance of the gradient coil, Igc is the inductance current, and the Rgc is an equivalent resistance of the gradient coil.

By the above calculation formula, the maximum inductance voltage value may be obtained when Igc is the maximum current value in the current sequence.

At step S02, a minimum DC voltage value corresponding to the maximum inductance voltage value is determined according to a relationship between output voltage and input voltage of the inverter circuit.

The inverter circuit is a circuit that converts a DC input voltage into an AC output voltage. And it may output a desired power voltage by controlling power semiconductors. Therefore, there can be a particular relationship between input voltage and output voltage of the inverter circuit. According to the relationship there between, the minimum values of the input voltage may be determined when the output voltage is the maximum inductance voltage value of the gradient coil, that is, the minimum DC voltage value of the input voltage.

It is to be understood that the relational expression between the input voltage and the output voltage may differ due to different circuit topologies of the inverter circuit. For ease of understanding, descriptions will be made with an inverter circuit being a CHB topology. FIG. 2A illustrates a CHB topology, e.g., a three-stage CHB topology. It may be known that the output voltage of the inverter circuit is related to a product of the input voltage and the duty cycle, which can be expressed as follows:

$$Vgc = V1 + V2 + V3 = (2D-1) \times (Vbus1 + Vbus2 + Vbus3) \quad (2),$$

where V1, V2, V3 are output voltages of different H-bridges, Vbus1, Vbus2 and Vbus3 are input voltages of different H-bridges respectively, and D is the duty cycle.

In some examples, the input voltage Vbus of each H-bridge is same. Thus, the above formula may be expressed as Vgc=3×(2D−1)×Vbus. When D is 1, the input voltage Vbus is smallest. In this way, the minimum DC voltage value Vbus of the input voltage of the inverter circuit may be determined to be ⅓Vgc.

In other examples, the input voltage of each H-bridge may be different as required. For example, the input voltage Vbus1 is same as Vbus3 and the input voltage Vbus2 is different from Vbus1 and Vbus3. In this case, when D is 1, the minimum DC voltage value of the input voltage of each H-bridge may be determined according to the proportion of each input voltage.

When the current sequence is processed by the inverter circuit, the input voltages of each H-bridge can have the minimum DC voltage values. Each input voltage may have the minimum DC voltage value, or may have a voltage value within a control accuracy range of the DC power supply of the minimum DC voltage value.

At step S03, an input voltage into the inverter circuit is controlled to have the minimum DC voltage value when the current sequence is input into the control terminal of the inverter circuit. A DC voltage having the minimum DC voltage value (or a minimum DC voltage) is input to the inverter circuit. The minimum DC input voltage may satisfy the requirement of the maximum inductance voltage value of the gradient coil, and other inductance voltage values may be then obtained by adjusting the duty cycle of the inverter circuit switch. This guarantees that the minimum DC voltage can meet the requirements of all currents in the current sequence for the input voltage. This voltage value is the minimum voltage value of all input voltages meeting the requirements. When the inverter circuit processes the current sequence, the smaller the input voltage of the inverter circuit is, the smaller the loss of the power semiconductor in the inverter circuit is, and the smaller the junction temperature fluctuation is. Accordingly, the service life and reliability of the entire gradient power amplifier can be improved.

In a practical application, especially in some preferred examples, the above determining method may be implemented in a spectrum analyzer. The spectrum analyzer calculates the current sequence corresponding to each imaging sequence, and then sends the current sequence to the controller of the gradient power amplifier. A current sequence forms when the gradient coil performs an imaging scan according to the corresponding imaging sequence. Each imaging sequence may be scanned for about 2-5 minutes. After the imaging sequence is scanned, there can be a pause of about 10 ms before a next imaging sequence is scanned. The above determining method may be executed in the spectrum analyzer in the time interval of the pause period or in advance. Before next current sequence is sent, the minimum DC voltage value corresponding to the current sequence may be sent to the gradient power amplifier, so that the input voltage of the inverter circuit of the gradient power amplifier is already adjusted to the corresponding minimum DC voltage value before the current sequence is sent. Thus, the minimum DC voltage value may be taken as a voltage value of the input voltage when the inverter circuit performs outputting according to the current sequence.

In other examples, the above method may be carried out in a processor module of the inverter circuit.

In some implementations, the inverter circuit is provided with an input voltage by a controllable DC power supply, and the minimum DC voltage value is a reference output voltage value of the controllable DC power supply.

After the minimum DC voltage value is determined, the minimum DC voltage value may be used as the reference output voltage value of the controllable DC power supply for the inverter circuit. During processing the current sequence, the minimum DC voltage value is used. While satisfying the processing requirement of the inverter circuit, the input voltage may be reduced as much as possible, so that the power consumption may be lowered and the fluctuations of junction temperature may be reduced, thereby improving the service life and reliability of the inverter circuit.

It is to be understood that different controllable DC power supply may have different output accuracies. The controllable DC power supply may accurately output a voltage having the minimum DC voltage value or a voltage having a voltage value close to the minimum DC voltage value within an accuracy range.

Figure 3:
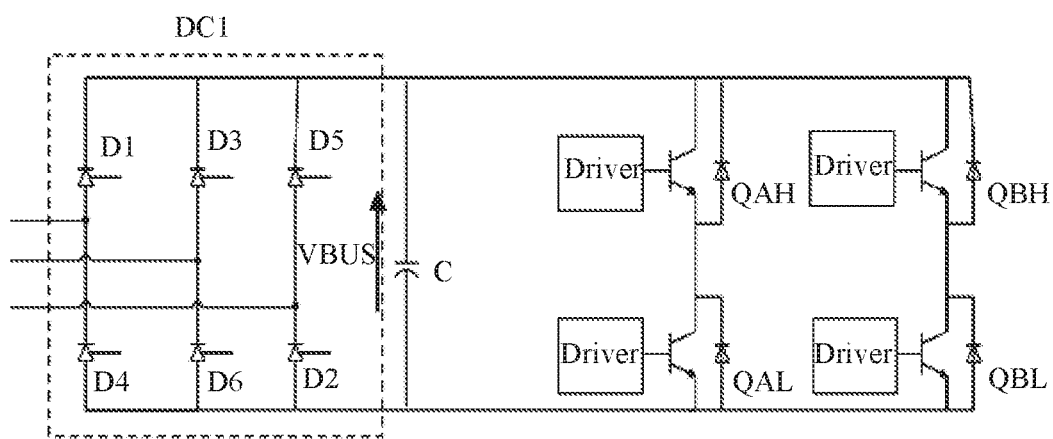
FIG. 3 is a schematic diagram illustrating a structure of a silicon control rectifier circuit according to an example of the present disclosure.

In some examples, as shown in FIG. 3, the controllable DC power supply is a silicon control rectifier (SCR) circuit DC 1. In this example, the SCR circuit may include SCR diodes D1 to D6, and input terminal of each branch is connected to a three-phase AC power supply respectively. With the minimum DC voltage value as a reference output voltage value, a desired DC voltage may be output by controlling the conduction angle of the SCR diodes. The structure of this regulated power supply is simple and easy to control. The other parts of FIG. 3 are as same as the H-bridge topologies circuit shown in FIG. 2B. QAH, QAL, QBH, QBL are four IGBTs. The output voltage of the H-bridge is controlled by controlling drivers and the IGBTs.

In other examples, the controllable DC power supply may also be any other controllable DC power supply meeting the input requirement of the inverter circuit, for example, a power supply with a step-down topology. With this power supply, the output can be controlled between 0 V and a peak voltage of a power grid for use by the inverter circuit. The step-down topology may be, for example, a buck converter. The above structures of the controllable DC power supply are merely illustrative, which are not specifically limited herein.

To improve the accuracy of the DC voltage output from the controllable DC power supply, closed-loop control may be performed on the output voltage of the controllable DC power supply. In the closed-loop control, the minimum DC voltage value is taken as a reference value Vbus_ref and an actual DC voltage value input into the inverter circuit is taken as a feedback value Vbus. The actual DC voltage value may be acquired by a voltage sensor.

Figure 4:
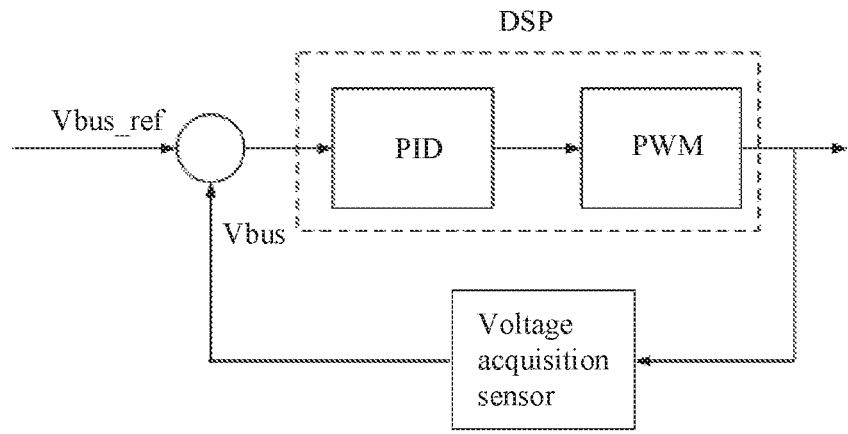
FIG. 4 is a schematic diagram illustrating a structure of a closed-loop control for an output voltage of a controllable DC power supply according to an example of the present disclosure.

FIG. 4 is a schematic diagram illustrating a closed-loop control of the output voltage of the controllable DC power supply. For the output of the SCR circuit, closed-loop control may be provided. The reference value Vbus_ref is compared with the feedback value Vbus. The comparison result is processed by a Proportional-Integral-Derivative (PID) controller to obtain a processed result, and then the conduction angle of the SCR circuit may be adjusted based on the processed result by Pulse Width Modulation (PWM), e.g., a pulse width modulator, thereby achieving the closed-loop control. The PID controller can continuously calculate an error value as the difference between the reference value and the feedback value and apply a correction based on proportional, integral, and derivative terms. In this way, the feedback value can be adjusted to be substantially identical to the reference value. This function may be implemented in a processor, and the processor may be a Digital Signal Processing (DSP) processor.

Figure 5:
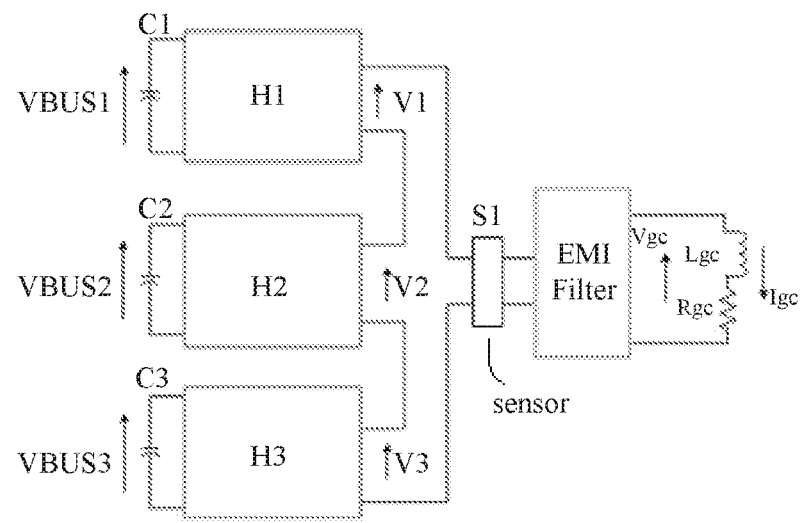
FIG. 5 is a schematic diagram illustrating a structure of an inverter circuit including a voltage acquisition sensor according to an example of the present disclosure.

The actual DC voltage value may be obtained by using a voltage acquisition sensor. To simplify circuit design and reduce costs, with the inverter circuit being the CHB topology shown in FIG. 5, the voltage acquisition sensor S1 may be disposed at the output terminal of the inverter circuit. The sensor S1 may obtain a pulsed voltage at the output terminal of the inverter circuit. The pulsed voltage may be then sampled to obtain a sampled voltage, e.g., by a sampling circuit. Then, after calculation, the actual DC voltage value input into each H-bridge may be determined from the sampled voltage according to different phases for the H-bridges.

Figure 6:
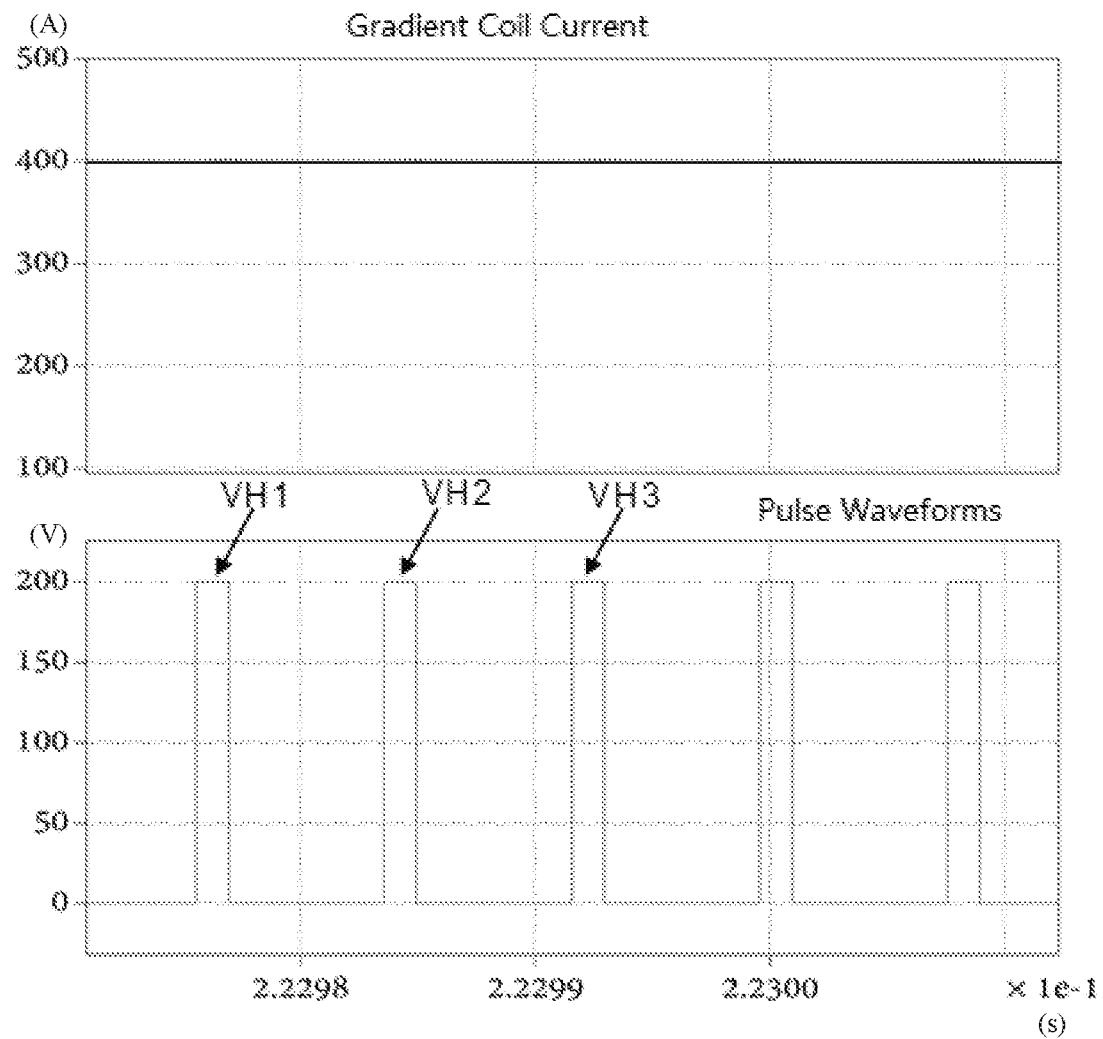
FIG. 6 is a schematic diagram illustrating a waveform of a sampled voltage according to an example of the present disclosure.

The voltage acquisition sensor may obtain a pulsed voltage from the output terminal of the inverter circuit. The voltage pulse may include a plurality pulse waveforms of all H-bridges output. And the pulse waveforms output by these H-bridges are out of phase with each other and have their specific phases respectively. As shown in FIG. 6, by taking a CHB topology for example, sampled voltages VH1, VH2, and VH3 may be obtained respectively after sampling. The actual output DC voltage value of each H-bridge may be determined from the sampled voltages according to different phases. Then, the input voltage value of each H-bridge may be calculated. By this method, it is not necessary to separately dispose a voltage acquisition sensor in each H-bridge, thereby reducing hardware disposition and decreasing the costs.

The technical effects of the present disclosure will be described below by taking an inverter circuit of the CHB topology as example. As shown in FIG. 2A and FIG. 2B, the inverter circuit of the CHB topology may include three H-bridges. Each H-bridge may include four IGBTs (QAH, QAL, QBH, and QBL) and one energy storage capacitor C. The H-bridge is provided with a DC input by a DC power supply VBUS.

When a current flows through the IGBTs in the inverter circuit, the IGBTs may generate losses. The losses mainly include switching loss Psw and conduction loss Pcond. Calculation formulas can be as follows:

$$Psw = (Eon + Eoff) \times \frac{Vbus}{Vbase} \times \frac{Ice}{Ibase} \times fsw, \quad (3)$$

where Eon is an IGBT turn-on switching loss, Eoff is an IGBT turn-off switching loss, Vbus is a voltage of the storage capacitor C. Vbase is a reference loss voltage measured in an IGBT specification, Ice is an IGBT conduction current, Ibase is a reference loss current measured in the IGBT specification, and fsw is an IGBT switching frequency;

$$Pcond = Vce \times Ice \times D \quad (4),$$

where Vce is an IGBT conduction voltage, Ice is an IGBT conduction current, and D is an IGBT conduction duty cycle.

Figure 7A:
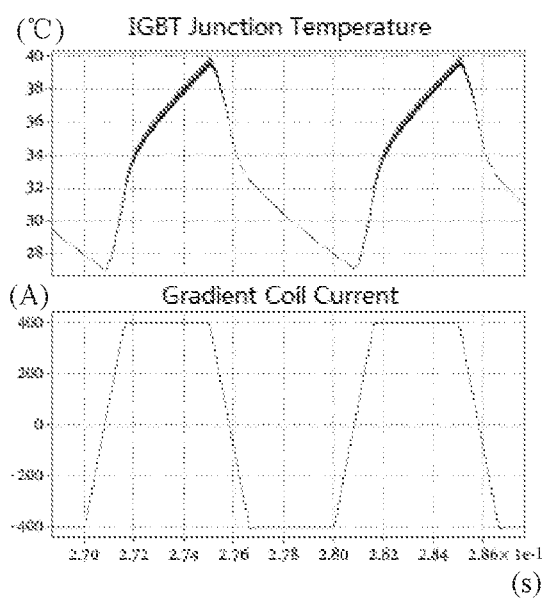
FIG. 7A and FIG. 7B are schematic diagrams illustrating junction temperature variation curves of an inverter circuit at different input voltages according to an example of the present disclosure.
Figure 7B:
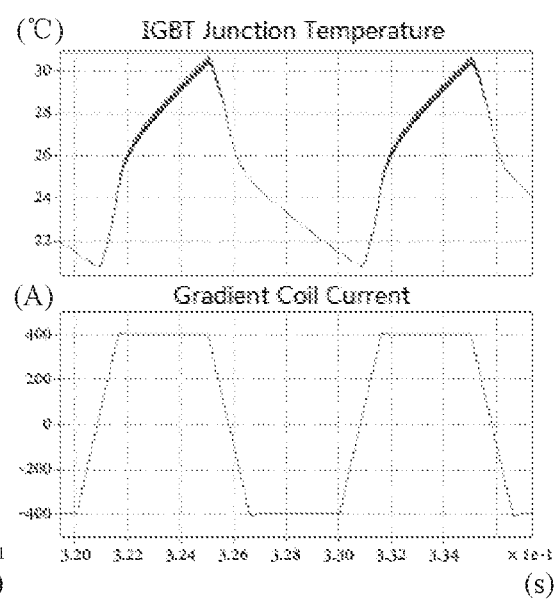

It can be seen that the switching loss Psw of the device is positively correlated with the DC input voltage Vbus. In an experiment, IGBT losses and junction temperature fluctuations at different DC input voltages are compared by using different DC input voltages Vbus for a same current sequence. Referring to FIGS. 7A and 7B, junction temperature variation curves of IGBTs is caused by current fluctuations at different DC input voltages Vbus, where the Vbus in FIG. 7A is 300 V and the Vbus in FIG. 7B is 200 V. Specific comparisons are shown in the following table:

| Vbus (V) | Pcond (W) | Psw (W) | Ptotal (W) | ΔTj (° C.) |
|---|---|---|---|---|
| 200 | 296.3 | 473.3 | 769.6 | 9 |
| 300 | 296.3 | 710 | 1001 | 11.6 |

Lgc = 294 uH
Rgc = 0.0872 Ω
dIgc/dt = 2.68 A/us Igc = 400 A

It can be seen that when the Vbus is small, the switching loss Psw of the IGBT is significantly lowered and the fluctuation of the junction temperature is also decreased. The service life of the IGBT module can be prolonged by lowering the switching loss and reducing the fluctuation of junction temperature. The inverter circuit usually includes power semiconductors that may have the problem of a shortened service life due to junction temperature variations.

Figure 8:
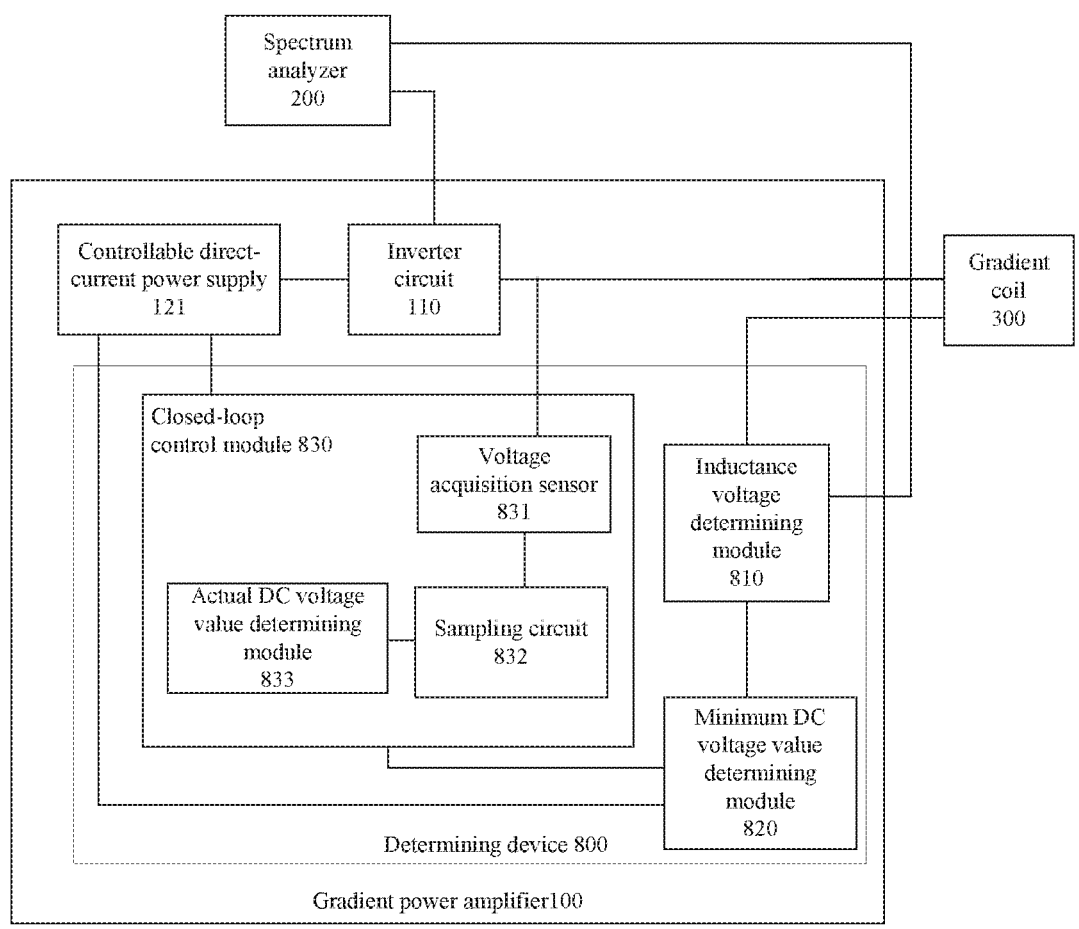
FIG. 8 is a schematic diagram illustrating a structure of a device for determining an input voltage of an inverter circuit according to an example of the present disclosure.

Moreover, the present disclosure also provides a device for implementing the above method. A device for determining an input voltage of an inverter circuit is provided, where an input terminal of the inverter circuit is configured to input a DC voltage, a control terminal of the inverter circuit is configured to input a current sequence, and an output terminal of the inverter circuit is configured to output an AC voltage, which is generated based on the DC voltage and the current sequence, to a gradient coil of a MRI system. As shown in FIG. 8, the device may include an inductance voltage determining module 810 and minimum DC voltage value determining module 820.

The inductance voltage determining module 810 is configured to determine a maximum inductance voltage value corresponding to a maximum current value in the current sequence according to a relationship between inductance voltage and inductance current of the gradient coil 300.

The minimum DC voltage value determining module 820 is configured to determine a minimum DC voltage value corresponding to the maximum inductance voltage value according to a relationship between output voltage and input voltage of the inverter circuit 110, and the minimum DC voltage value is taken as a voltage value of the input voltage input into the input terminal of the inverter circuit 110 when the current sequence is input into the control terminal of the inverter circuit.

The inductance voltage determining module 810 and the minimum DC voltage value determining module 820 can be implemented by at least one processor and at least one non-transitory machine-readable storage medium coupled to the at least one processor having machine-executable instructions stored thereon that, when executed by the at least one processor, cause the at least one processor to perform operations that the inductance voltage determining module 810 and the minimum DC voltage value determining module 820 are configured to perform.

Further, the input voltage of the inverter circuit 110 may be provided by a controllable DC power supply 121.

Further, the controllable DC power supply 121 may be a SCR circuit. Set the SCR circuit output voltage to the minimum DC voltage. Control the conduction angle of the SCR diode and output the voltage.

Further, the device may also include a controller, e.g., a closed-loop control module 830, configured to perform a closed-loop control on the output voltage of the controllable DC power supply 121. In the closed-loop control, the minimum DC voltage value is taken as a reference value and the actual DC voltage value input into the inverter circuit 110 is taken as a feedback value.

Further, in the case that the inverter circuit 110 is a CHB topology, the closed-loop control module 830 may include: a voltage acquisition sensor 831 disposed at the output terminal of the inverter circuit 110 and configured to obtain a pulsed voltage at the output terminal of the inverter circuit 110; a sampling circuit 832 configured to sample the pulsed voltage to obtain a sampled voltage; and an actual DC voltage value determining module 833 configured to determine the actual DC voltage value input into each H-bridge from the sampled voltage according to different phases.

In addition, the present disclosure also provides a MRI system including any device for determining the DC voltage to be input into the inverter circuit as described above. In different examples, the MRI system may have different structures.

With reference to FIG. 8, the MRI system includes a gradient power amplifier 100, a spectrum analyzer 200, a gradient coil 300, and a determining device 800. The gradient power amplifier 100 also includes an inverter circuit 110, and a DC power supply (a controllable DC power supply 121 as shown).

The DC power supply is configured to output a DC voltage.

The inverter circuit 110 is configured to generate an AC voltage according to the DC voltage and a current sequence. An input terminal of the inverter circuit is connected to the DC power supply.

The spectrum analyzer 200 is connected to a control terminal of the inverter circuit 110 and configured to output the current sequence to the inverter circuit.

The gradient coil 300 is connected to an output terminal of the inverter circuit 110 and configured to receive the AC voltage from the inverter circuit 110.

The determining device 800 can be any device for determining the DC voltage to be input into the inverter circuit as described above.

In some implementations, a main control module may be disposed in the spectrum analyzer 200 to send instructions of current sequences and to proceed with imaging processing and the like. In some examples, implementation may be based on an existing MRI system. The above determining device 800 may be disposed in the main control module of the spectrum analyzer 200 without adding more hardware, and meanwhile, structural changes are less.

In a specific application, the spectrum analyzer may predetermine the minimum DC voltage and send it to the controllable DC power supply in advance. The spectrum analyzer may send the minimum DC voltage needed for a next imaging scan in an interval of two imaging scans. The output voltage of the controllable DC power supply may be set as the minimum DC voltage, and then the inverter circuit may output the desired current sequence to the gradient coil to complete this imaging scan.

In other examples, the above device 800 for determining the input voltage of the inverter circuit may be disposed in the gradient power amplifier 100.

In a specific application, the spectrum analyzer may send the current sequence to the gradient power amplifier in advance. The spectrum analyzer may send the current sequence in the interval of two imaging scans. The determining device in the gradient power amplifier may first determine the minimum DC voltage and then set the output voltage of the controllable DC power supply as the minimum DC voltage. Subsequently, the inverter circuit may output the desired current sequence to the gradient coil to complete this imaging scan.

Embodiments of the subject matter and the functional operations described in this present disclosure can be implemented in digital electronic circuitry, in tangibly-embodied computer software or firmware, in computer hardware, including the structures disclosed in this present disclosure and their structural equivalents, or in combinations of one or more of them. Embodiments of the subject matter described in this present disclosure can be implemented as one or more computer programs, i.e., one or more modules of computer program instructions encoded on a tangible non-transitory program carrier for execution by, or to control the operation of, data processing apparatus. Alternatively or in addition, the program instructions can be encoded on an artificially-generated propagated signal, e.g., a machine-generated electrical, optical, or electromagnetic signal, that is generated to encode information for transmission to suitable receiver apparatus for execution by a data processing apparatus. The computer storage medium can be a machine-readable storage device, a machine-readable storage substrate, a random or serial access memory device, or a combination of one or more of them.

The processes and logic flows described in the present disclosure can be performed by one or more programmable computers executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application-specific integrated circuit).

Computers suitable for the execution of a computer program include, by way of example, can be based on general or special purpose microprocessors or both, or any other kind of central processing unit. Generally, a central processing unit will receive instructions and data from a read-only memory or a random access memory or both. The essential elements of a computer are a central processing unit for performing or executing instructions and one or more memory devices for storing instructions and data.

Generally, a computer will also include, or be operatively coupled to receive data from or transfer data to, or both, one or more mass storage devices for storing data, e.g., magnetic, magneto-optical disks, or optical disks. However, a computer need not have such devices. Moreover, a computer can be embedded in another device, e.g., a mobile telephone, a personal digital assistant (PDA), a mobile audio or video player, a game console, a Global Positioning System (GPS) receiver, or a portable storage device, e.g., a universal serial bus (USB) flash drive, to name a few.

Computer-readable media suitable for storing computer program instructions and data include all forms of non-volatile memory, media and memory devices, including by way of example semiconductor memory devices, e.g., EPROM, EEPROM, and flash memory devices; magnetic disks, e.g., internal hard disks or removable disks; magneto-optical disks; and CD-ROM and DVD-ROM disks. The processor and the memory can be supplemented by, or incorporated in, special purpose logic circuitry.

For simplicity and illustrative purposes, the present disclosure is described by referring mainly to examples thereof. In the above descriptions, numerous specific details are set forth in order to provide a thorough understanding of the present disclosure. It will be readily apparent however, that the present disclosure may be practiced without limitation to these specific details. In other instances, some methods and structures have not been described in detail so as not to unnecessarily obscure the present disclosure. As used herein, the terms "a" and "an" are intended to denote at least one of a particular element, the term "includes" means includes but not limited to, the term "including" means including but not limited to, and the term "based on" means based at least in part on.

The above description is merely preferred examples of the present disclosure and is not intended to limit the present disclosure in any form. Although the present disclosure is disclosed by the above examples, the examples are not intended to limit the present disclosure. Those skilled in the art, without departing from the scope of the technical scheme of the present disclosure, may make a plurality of changes and modifications of the technical scheme of the present disclosure by the method and technical content disclosed above.

Therefore, without departing from the scope of the technical scheme of the present disclosure, based on technical essences of the present disclosure, any simple alterations, equal changes and modifications should fall within the protection scope of the technical scheme of the present disclosure. Accordingly, other embodiments are within the scope of the following claims.

What is claimed is:

1. A method of determining an input voltage of an inverter circuit of a magnetic resonance imaging system, the method comprising:
   determining a maximum inductance voltage value corresponding to a maximum current value of a current sequence by calculating an inductance voltage of a gradient coil of the magnetic resonance imaging system according to a relationship between inductance voltage and inductance current of the gradient coil of the magnetic resonance imaging system;
   determining a minimum DC voltage value corresponding to the maximum inductance voltage value by calculating an input voltage of the inverter circuit according to a relationship between the inductance voltage of the gradient coil and input voltage of the inverter circuit; and
   controlling the input voltage into an input terminal of the inverter circuit to have the minimum DC voltage value when the current sequence is input into a control terminal of the inverter circuit,
   wherein the inverter circuit is configured to generate an AC voltage based on the input voltage and the current sequence and output the generated AC voltage to the gradient coil via an output terminal of the inverter circuit.

2. The method of claim 1, wherein the input voltage of the inverter circuit is provided by a controllable DC power supply.

3. The method of claim 2, wherein the controllable DC power supply comprises a silicon control rectifier (SCR) circuit.

4. The method of claim 2, wherein the controllable DC power supply is configured to output a DC voltage through a closed-loop control with the minimum DC voltage value as a reference value and an actual value of the DC voltage into the inverter circuit as a feedback value.

5. The method of claim 4, wherein the inverter circuit comprises a plurality of cascaded H-bridges, and a voltage acquisition sensor is disposed at the output terminal of the inverter circuit and configured to obtain a pulsed voltage at the output terminal of the inverter circuit,
   wherein the method further comprises:
   sampling the pulsed voltage to obtain a sampled voltage; and
   determining the actual value of the DC voltage input into each of the H-bridges from the sampled voltage according to different phases for the H-bridges.

6. The method of claim 4, further comprising:
   comparing the minimum DC voltage value with the actual value of the DC voltage to obtain a comparison result;
   processing the comparison result by a proportional-integral-derivative (PID) controller to obtain a processed result; and
   adjusting a conduction angle of the controllable DC power supply by pulse width modulation (PWM) based on the processed result such that the actual value of the DC voltage is substantially identical to the minimum DC voltage value.

7. The method of claim 1, wherein the relationship between inductance voltage and inductance current of the gradient coil is expressed as below:

$$Vgc = Lgc \times \frac{dIgc}{dt} + Igc \times Rgc,$$

where Vgc represents the inductance voltage, Lgc represents an inductance of the gradient coil, Igc represents the inductance current, Rgc represents an equivalent resistance of the gradient coil, and t represents time.

8. The method of claim 1, wherein the relationship between the inductance voltage of the gradient coil and input voltage of the inverter circuit is expressed as below:

$$Vgc = nVout = (2D-1) \times nVbus,$$

where Vgc represents an inductance voltage of the gradient coil, Vbus and Vout respectively represent an input voltage of an H-bridge of the inverter circuit, n represents a number of H-bridges of the inverter circuit, and D represents the duty cycle.

9. A device for determining an input voltage of an inverter circuit of a magnetic resonance imaging system, the device comprising:

at least one processor;
at least one non-transitory machine-readable storage medium coupled to the at least one processor having machine-executable instructions stored thereon that, when executed by the at least one processor, cause the at least one processor to perform operations comprising:
  determining a maximum inductance voltage value corresponding to a maximum current value of a current sequence by calculating an inductance voltage of a gradient coil of the magnetic resonance imaging system according to a relationship between inductance voltage and inductance current of the gradient coil of the magnetic resonance imaging system; and
  determining a minimum DC voltage value corresponding to the maximum inductance voltage value by calculating an input voltage of the inverter circuit according to a relationship between the inductance voltage of the gradient coil and input voltage of the inverter circuit; and
a controller configured to control the input voltage into an input terminal of the inverter circuit to have the minimum DC voltage value when the current sequence is input into a control terminal of the inverter circuit,
wherein the inverter circuit is configured to generate an AC voltage based on the input voltage and the current sequence and output the generated AC voltage to the gradient coil via an output terminal of the inverter circuit.

10. The device of claim 9, wherein the input voltage of the inverter circuit is provided by a controllable DC power supply.

11. The device of claim 10, wherein the controllable DC power supply comprises an SCR circuit.

12. The device of claim 10, wherein the controller is configured to:
  perform a closed-loop control on a DC voltage output from the controllable DC power supply by taking the minimum DC voltage value as a reference value and an actual value of the DC voltage into the inverter circuit as a feedback value.

13. The device of claim 12, wherein the inverter circuit comprises a plurality of cascaded H-bridges, and
wherein the controller is configured to:
  obtain a pulsed voltage at the output terminal of the inverter circuit from a voltage acquisition sensor disposed at the output terminal of the inverter circuit;
  obtain a sampled voltage by sampling the pulsed voltage; and
  determine the actual value of the DC voltage input into each of the H-bridges from the sampled voltage according to different phases for the H-bridges.

14. The device of claim 12, wherein the controller comprises:
  a comparator configured to compare the minimum DC voltage value with the actual value of the DC voltage to obtain a comparison result;
  a proportional-integral-derivative (PID) controller configured to process the comparison result to obtain a processed result; and
  a pulse width modulator configured to adjust a conduction angle of the controllable DC power supply based on the processed result such that the actual value of the DC voltage is substantially identical to the minimum DC voltage value.

15. A magnetic resonance imaging system comprising:
a gradient power amplifier comprising:
  a DC power supply configured to output a DC voltage;
  an inverter circuit connected to the DC power supply at an input terminal and configured to generate an AC voltage according to the DC voltage and a current sequence;
a spectrum analyzer connected to a control terminal of the inverter circuit and configured to output the current sequence to the inverter circuit;
a gradient coil connected to an output terminal of the inverter circuit and configured to receive the AC voltage from the inverter circuit; and
a device for determining an input voltage of the inverter circuit, the device comprising:
  at least one processor;
  at least one non-transitory machine-readable storage medium coupled to the at least one processor having machine-executable instructions stored thereon that, when executed by the at least one processor, cause the at least one processor to perform operations comprising:
    determining a maximum inductance voltage value corresponding to a maximum current value of the current sequence by calculating an inductance voltage of the gradient coil according to a relationship between inductance voltage and inductance current of the gradient coil; and
    determining a minimum DC voltage value corresponding to the maximum inductance voltage value by calculating an input voltage of the inverter circuit according to a relationship between the inductance voltage of the gradient coil and input voltage of the inverter circuit; and
  a controller configured to control the input voltage into the input terminal of the inverter circuit to have the minimum DC voltage value when the current sequence is input into the control terminal of the inverter circuit.

16. The magnetic resonance imaging system of claim 15, wherein the DC power supply is a controllable DC power supply, and
  wherein the controller is configured to perform a closed-loop control on a DC voltage output from the controllable DC power supply by taking the minimum DC voltage value as a reference value and an actual value of the DC voltage into the inverter circuit as a feedback value.

17. The magnetic resonance imaging system of claim 16, wherein the inverter circuit comprises a plurality of cascaded H-bridges, and
  wherein the controller comprises:
    a voltage acquisition sensor disposed at the output terminal of the inverter circuit and configured to obtain a pulsed voltage at the output terminal of the inverter circuit; and
    a sampling circuit configured to sample the pulsed voltage to obtain a sampled voltage, and
  wherein the controller is configured to determine the actual value of the DC voltage input into each of the H-bridges from the sampled voltage according to different phases for the H-bridges.

18. The magnetic resonance imaging system of claim 16, wherein the controller comprises:
  a comparator configured to compare the minimum DC voltage value with the actual value of the DC voltage to obtain a comparison result;

a proportional-integral-derivative (PID) controller configured to process the comparison result to obtain a processed result; and a pulse width modulator configured to adjust a conduction angle of the controllable DC power supply based on the processed result such that the actual value of the DC voltage is substantially identical to the minimum DC voltage value.

19. The magnetic resonance imaging system of claim 15, wherein the spectrum analyzer is configured to output the current sequence to the inverter circuit after the input voltage of the inverter circuit is adjusted to have the minimum DC voltage value.

20. The magnetic resonance imaging system of claim 19, wherein the spectrum analyzer is configured to calculate a respective current sequence corresponding to an imaging sequence for each imaging scan, and wherein the input voltage of the inverter circuit is adjusted to have the minimum DC voltage value between an interval of two adjacent imaging scans.

* * * * *